(12) United States Patent
Yang

(10) Patent No.: US 9,698,749 B2
(45) Date of Patent: Jul. 4, 2017

(54) IMPEDANCE MATCHING DEVICE WITH COUPLED RESONATOR STRUCTURE

(71) Applicant: Freescale Semiconductor, Inc., Austin, TX (US)

(72) Inventor: Nick Yang, Wilmette, IL (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/846,668

(22) Filed: Sep. 4, 2015

(65) Prior Publication Data

US 2017/0070202 A1    Mar. 9, 2017

(51) Int. Cl.
| | |
|---|---|
| *H01P 5/12* | (2006.01) |
| *H03H 7/40* | (2006.01) |
| *H03H 7/09* | (2006.01) |
| *H03H 7/38* | (2006.01) |
| *H01F 38/14* | (2006.01) |
| *H03H 9/02* | (2006.01) |

(52) U.S. Cl.
CPC ............... *H03H 7/40* (2013.01); *H01F 38/14* (2013.01); *H03H 7/09* (2013.01); *H03H 7/38* (2013.01); *H03H 9/02* (2013.01); *H01F 2038/146* (2013.01)

(58) Field of Classification Search
CPC ...... H01P 7/40; H01F 38/14; H01F 2038/146; H03H 9/02
USPC .......................................................... 333/125
See application file for complete search history.

(56) References Cited

U.S. PATENT DOCUMENTS

| | | | | |
|---|---|---|---|---|
| 3,792,384 A | * | 2/1974 | Hunt ..................... | H01L 23/647 257/539 |
| 6,586,309 B1 | * | 7/2003 | Yeo ..................... | H01L 23/5227 257/531 |
| 9,184,722 B2 | * | 11/2015 | Bakalski ............. | H04B 1/0458 |
| 2012/0229210 A1 | | 9/2012 | Jones et al. | |
| 2013/0207741 A1 | | 8/2013 | Presti | |
| 2014/0176242 A1 | | 6/2014 | Lin | |
| 2015/0129755 A1 | | 5/2015 | Hiley | |

FOREIGN PATENT DOCUMENTS

WO      2016118288 A1    7/2016

OTHER PUBLICATIONS

Extended European Search Report dated Nov. 22, 2016 in EP Application No. 16186884.9.

* cited by examiner

*Primary Examiner* — Robert Pascal
*Assistant Examiner* — Kimberly Glenn

(57) ABSTRACT

An impedance matching device is presented. The device includes an input terminal configured to receive a radio frequency signal, and an output terminal configured to couple to an amplifier. The device includes an impedance prematch network coupled to the input terminal and the output terminal. The impedance prematch network includes a first inductor, such as a first wire bond. The device includes a resonator structure including a second inductor, such as a wire bond, inductively coupled to the first inductor.

20 Claims, 8 Drawing Sheets

IMPEDANCE MATCHING DEVICE WITH COUPLED RESONATOR STRUCTURE

BACKGROUND

Field of Use

The present disclosure relates generally to impedance matching networks, and more specifically to an impedance matching device incorporating a coupled resonator structure.

Description of the Related Art

Various electronic systems employ power amplifiers for increasing the power of signals such as high frequency signals. In a wireless communication system, a power amplifier is usually the last amplifier in a transmission chain (i.e., the output stage). High gain, high linearity, stability, and a high level of efficiency—the ratio of radio frequency (RF) output power to direct current (DC) power—are characteristics of an ideal amplifier.

In the area of RF circuit design, amplifier operation can be optimized by providing an impedance match at the input or output of the amplifier. The failure to achieve such an impedance match can be problematic in the design of electronic equipment (e.g. audio, wireless communications, etc.), where un-matched impedances can substantially reduce amplifier performance and signal quality. Impedance matching can be accomplished by transforming either the impedance at an output of a package or device supplying an input signal to the amplifier or at the input to the amplifier itself.

To date, various impedance matching networks have been implemented for achieving impedance matching in an RF circuit. Typically, such networks utilize combinations of capacitors, inductors, and resistors along with transmission lines to achieve the intended matching. One example of such a system is an LC match network comprised of an inductor "L" and capacitor "C."

The conventional impedance matching networks typically require a relatively large amount of space to implement, particularly in sub-gigahertz applications, even in integrated solutions and particularly if the conventional network incorporates a resonator structure for harmonic termination. As such, conventional impedance matching networks may not be optimal when utilized in high-power amplifier implementations in which a relatively small package space is generally preferred or desired.

BRIEF DESCRIPTION OF THE DRAWINGS

The present disclosure is illustrated by way of examples and embodiments and is not limited by the accompanying figures, in which like reference numbers indicate similar elements. For simplicity and clarity of illustration, the drawing figures illustrate the general manner of construction, and details of well-known features and techniques may be omitted to avoid unnecessarily obscuring the invention. Elements in the figures are illustrated for simplicity and clarity and have not been necessarily drawn to scale. In fact, the dimensions of some of the elements or regions in the figures may be exaggerated relative to other elements or regions to better understand embodiments of the apparatus. The figures together with the detailed description are incorporated and form part of the specification and serve to further illustrate examples, embodiments and the like, and explain various principles and advantages, in accordance with the present disclosure, where.

DETAILED DESCRIPTION

Embodiments of the present invention provide an impedance matching device that improves performance and reduces the package size of packaged power amplifiers. The power amplifiers may be used in apparatuses or devices dependent upon semiconductor packages in which low cost, low weight, and small volume is desired. The embodiments described herein may provide an improved approach for enabling impedance matching at an input to a power amplifier, where the impedance matching device provides a coupled line resonator. In one embodiment of the present impedance matching device, components of the device are coupled to one another via inductive/capacitive coupling. For example, a resonator structure may be inductively coupled to an impedance prematch network within the device. This approach enables the impedance matching device to be implemented with components connected in parallel, rather than the conventional approach of series-connected or cascaded components. Conventional devices, for example, may utilize a double T-match or inductor-capacitor (LC)-LC topology, which require substantial lateral space to implement in order to achieve desired impedance values. The present parallel arrangement can require less space to implement than a conventional cascading approach, which may reduce overall package size.

In one embodiment, the inductive coupling is achieved at least partly through wire bonds that are connected to the resonator structure and impedance prematch network. In such an arrangement, the configuration of both wire bonds, such as their lengths, can be selected to achieve a desired amount of mutual inductance and, thereby, fine-tune the operation of the impedance matching network. Note that throughout the present disclosure, references to inductive coupling are intended to also cover and include inductive-capacitive coupling.

The resonator structure in the present impedance matching network may be configured to add stability to unstable frequency regions of a connected amplifier, without sacrificing excessive amounts of gain over the amplifier's entire frequency response. The resonator structure may also operate to remove low frequency resonance that may be caused by shunt capacitances and printed circuit board (PCB) bias line structure. The present approach may also enable impedance matching over harmonic frequencies for harmonic-sensitive devices.

Figure 1:
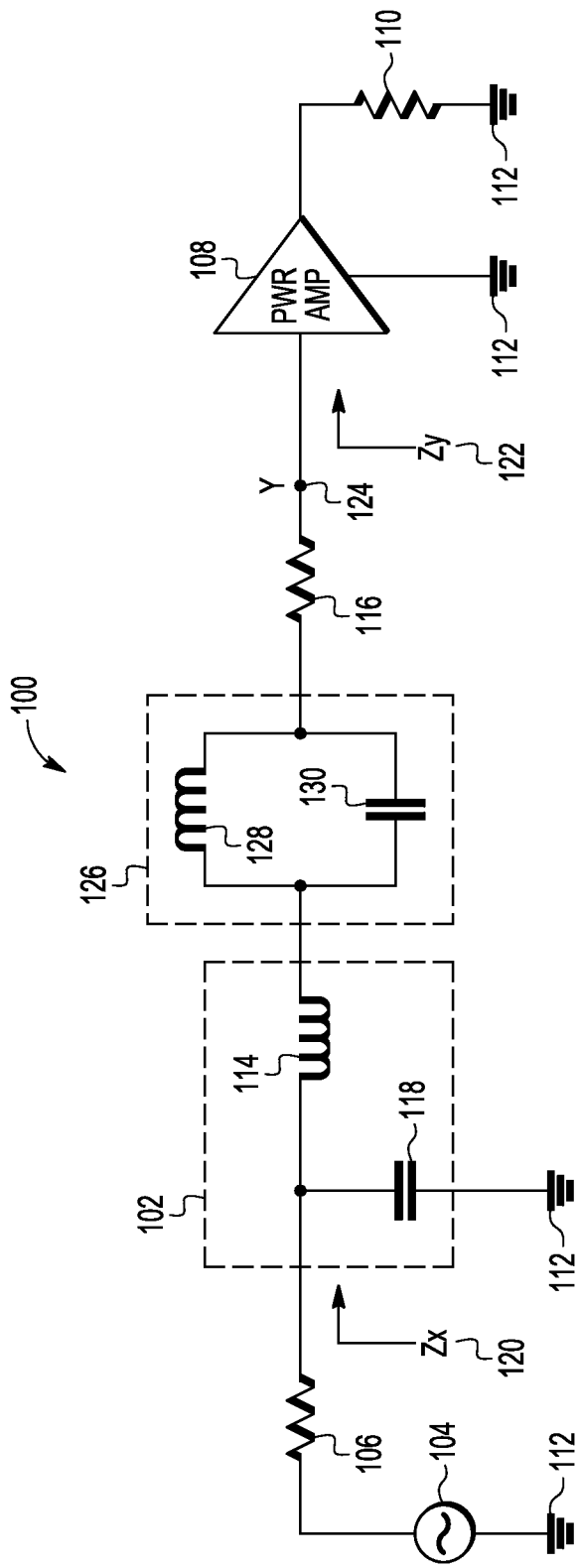
FIG. 1 is a schematic depicting a conventional prematch network connected to a separate resonator structure coupled to a power amplifier.

FIG. 1 is a schematic depicting a conventional prematch network connected to a separate resonator structure. Although conventional prematch networks don't usually include a resonator structure (instead being implemented as LC-LC or double T match prematch networks or LC plus a shunt inductor prematch networks), sometimes a resonator structure may be incorporated to provide harmonic termination. Circuit 100 may be an RF circuit for an electronic device (e.g., a wireless communications base station) and generally includes signal source 104, resistor 106, power amplifier 108, load resistor 110, resistor 116, and ground nodes 112. It should be understood that although circuit 100 is described as being an RF circuit, other circuit types could be implemented. Moreover, it should be understood that the components depicted are not intended to be limiting and circuit 100 could include additional resistors, capacitors, power amplifiers, and the like.

Prematch network 102 includes inductor 114, and capacitor 118. Prematch network 102 is generally configured so that source side impedance Zx 120 matches the input (load) side impedance Zy 122 (i.e., at input 124 of power amplifier 108). For example, if source side impedance Zx 120 is 50 Ohms, input side impedance Zx 120 should also be approximately 50 Ohms. The failure to match the impedances could result in sub-standard performance of the circuit and, specifically reduced efficiency of amplifier 108. In this example, prematch network 102 functions to match the input side impedance Zy 122 to the source side impedance Zx 120.

As used herein, input side is meant to refer to the input of the power amplifier 108. However, it is understood that other terminology could be used. For example the input could be referred to as the load side or gate/base of the power amplifier transistor (not shown).

Circuit 100 includes resonator structure 126. Resonator structure 126 is made up of inductor 128 and capacitor 130 connected in parallel. Within circuit 100, resonator structure 126 can be implemented to provide harmonic impedance termination. In that case, resonator structure 126 generates a relatively high output current or voltage at a particular frequency of interest (i.e., a frequency at least partially determined by the primary frequencies of operation of amplifier 108). At other frequencies, resonator structure 126 may resemble an impedance, and will not pass signals at frequencies at those other than those at the frequencies of interest. In some embodiments, resonator structure 126 may be configured to resonate at harmonic frequencies of a primary frequency of operation of amplifier 108.

As illustrated by FIG. 1, prematch network 102 and resonator structure 126 are coupled to one another in series. As discussed above, this arrangement may be referred to as a cascading implementation. Such a configuration requires a relatively large amount of lateral spacing of the components making up prematch network and resonator structure 126. This increases the overall package size of prematch network 102 and resonator structure 126. Additionally, in this configuration resonator structure 126 is connected within the signal path flow from signal source 104 to amplifier 108. As such, resonator structure 126 will dissipate some of the power of the signal generated by signal source 104 in the frequency of operation of amplifier 108. This may also reduce the overall efficiency of circuit 100.

In accordance with the present disclosure, an impedance matching device is provided in which an impedance prematch network is connected in parallel to a resonator structure. Such an arrangement may reduce the overall size of the impedance matching device. The impedance prematch network is connected directly in-line with a signal path, while the resonator structure is not in the signal path. As such, the configuration may reduce losses that would result from the resonator structure being coupled in series with the impedance prematch network (i.e., in the configuration of FIG. 1). In this arrangement, the parallel resonator structure may also add stability to the frequency regions in which a connected amplifier would otherwise be unstable. In a prematch structure, the matching element that includes the combination of inductors and capacitors may have losses associated with particular frequencies. These losses can be treated as series resistors. When two prematch topologies, such as a double T match network, are used, two series resistances are added in cascade fashion. Signal passes through two series resistors often times over a broad frequency band. Utilizing the present parallel resonator structure, however, the resonator structure can be designed to resonate at a designated range of frequencies to compensate for the losses of the resonator structure. Since the resonator structure loss is seen in a particular frequency of interest, such as the unstable region of the amplifier, the remaining frequency band performance can be preserved. In some cases, this benefit may be achieved without reducing overall gain throughout the amplifier's entire frequency response.

As described in more detail below, the present impedance matching device may be implemented entirely within a single integrated passive device (IPD) structure or combinations of such structures. In that case, the various components, including capacitors, inductors, and resistors of each of the prematch network and resonator structure may be implemented together within a single IPD package. The IPD package can then be connected between a signal source and an amplifier to provide the package's impedance matching and resonating functionality.

When implemented within a single IPD package, the attributes of the various components of the impedance matching network (e.g., the capacitances of the capacitors, inductances of the inductors, and the resistances of the resistors) can be controlled precisely, resulting in less variance between designed values for the package and the actual values in the fabricated package. Embodiments of the present impedance matching network implemented within an IPD are shown in FIGS. 2 and 3.

Figure 2:
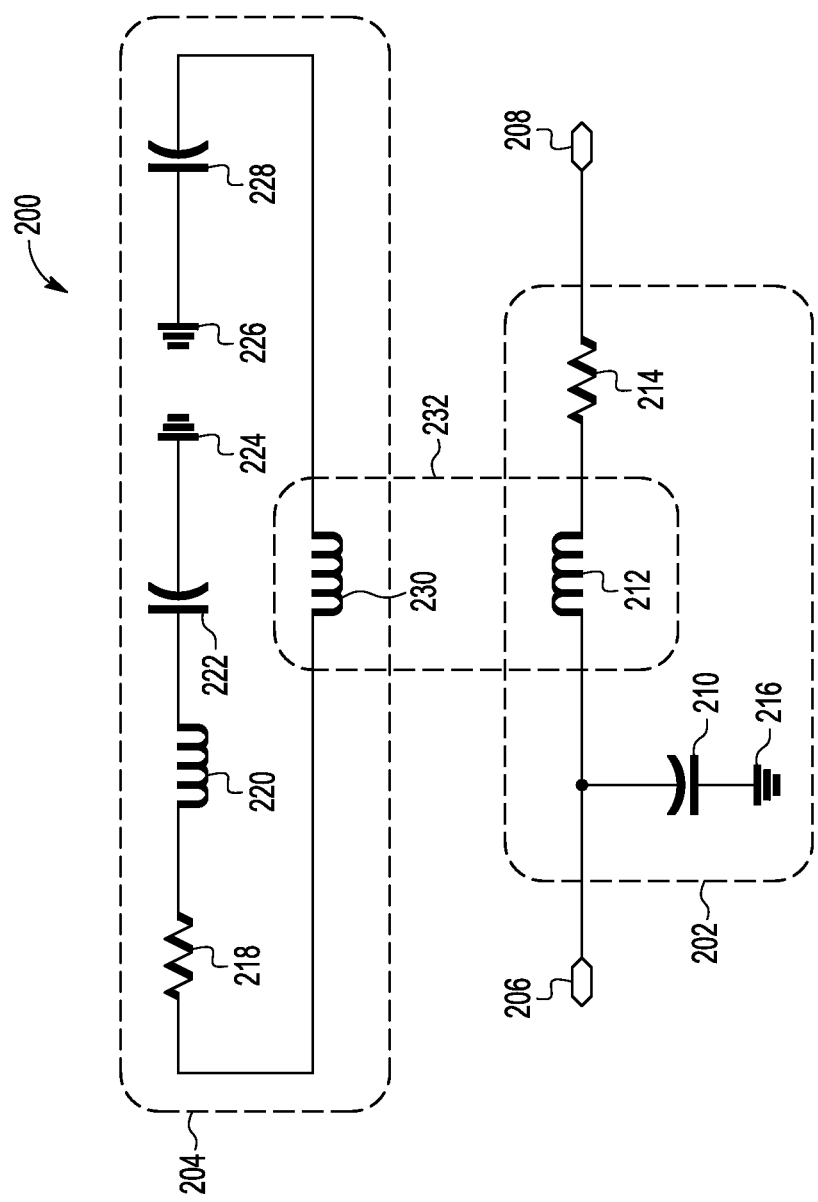
FIG. 2 is a schematic depicting an impedance matching device including a prematch network connected in parallel to a resonator structure.
Figure 3:
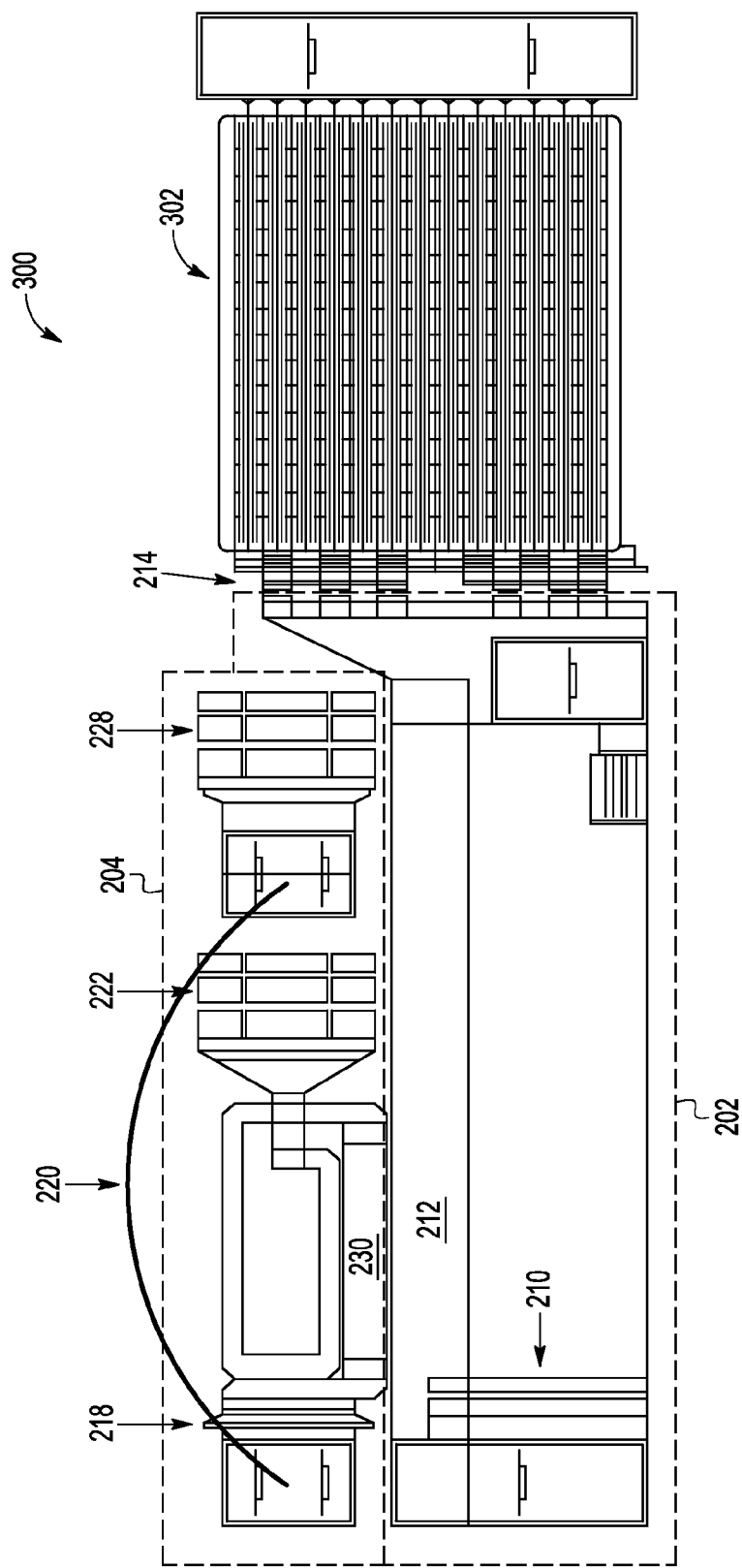
FIG. 3 shows an integrated circuit (IC) layout on a semiconductor die forming an integrated passive device (IPD) implementing the impedance match network of FIG. 2.

FIG. 2 is a schematic depicting an impedance matching network 200 including prematch network 202 connected in parallel to resonator structure 204. Network 200 includes input 206. Input 206 is configured to couple to a signal source, such as a package reference plane. Input 206 may be configured to couple to a signal source directly or through a resistor. Similarly, network 200 includes output 208. Output 208 is configured to couple to an amplifier, such as a power transistor. In various embodiments, output 208 may couple to a power transistor, in which case output 208 may couple to the transistor's reference plane. In various embodiments, the amplifier to which output 208 connects may be implemented using laterally diffused metal oxide semiconductor (LDMOS) or field effect transistors (FET) technology.

In the present disclosure, the term 'power transistor' also encompasses lower-power transistors, such as those suitable for use in mobile phone technology, where the output power is of the order of approximately 1 W. Furthermore, it is anticipated that embodiments of the invention are suitable in non-final power amplifier stages, such as for use in pre-amplifier networks. In addition, it is anticipated that embodiments of the invention may be implemented in any type of RF amplifier device package. It is also anticipated that embodiments of the invention may be implemented with any type of RF transistor technology, such as LDMOS, gallium nitride (GaN), bipolar technology, etc.

Prematch network 202 is connected directly to both input 206 and output 208, while, as shown in FIG. 2, resonator structure 204 is not directly connected to input 208, output 208, or prematch network 202.

Prematch network 202 includes capacitor 210 having a first terminal coupled to input 206 and a second terminal coupled to ground terminal 216. Inductor 212 is coupled between capacitor 210 and resistor 214. In this configuration, the combination of capacitor 210 and inductor 212 operate as a T match topology. In other embodiments, prematch network 202 could instead utilize a shunt L match topology, or any other combination of components arranged to provide the desired impedance matching.

The various component values of capacitor 210, inductor 212, and resistor 214 can be selected to achieve a desired operation of prematch network 202 according to known circuit design techniques.

Resonator structure 204 includes resistor 218 coupled to inductor 220, which is, in turn, connected to capacitor 222, which is, in turn, connected to ground node 224. Ground node 226 is coupled to capacitor 228. Inductor 230 is coupled between resistor 218 and capacitor 228. In various embodiments, inductor 220 may serve as a frequency tuning element for resonator structure 204. Capacitor 222 and capacitor 228 may also operate as tuning elements for resonator structure 204. Resistor 218 may operate as an attenuating element to reduce overall instability or raise impedance over the resonated frequency of resonator structure 204. In various other embodiments, resonator structure 204 (as well as other resonator structures 404, 602, and 604) may be implemented in different configurations with different combinations of components. For example, the order and arrangement of components may be adjusted. In some embodiments, the order of inductor 220 and capacitor 222 could be reversed so that inductor 220 becomes the grounding element. Additionally, capacitors 222 and 228 need not be grounded and may, in some cases, be combined into a single capacitor. Resistor 218 may also be removed (for example, if losses are not an issue).

Resonator structure 204 is not directly electrically coupled to prematch network 202. That is, an electrically conductive (i.e., metal) structure is not connected between resonator structure 204 and prematch network 202 to put them in electrical communication with one another. Instead resonator structure 204 is inductively coupled to prematch network 202 as a result of inductor 230 and inductor 212 being mutually coupled as indicated by dashed line 232. The mutual inductance of inductors 230 and 212 can be controlled by the configuration of inductors 230 and 212, such as the length and width of inductors 230 and 212, as well as their proximity to one another.

In this arrangement, as current flows through prematch network 202 and, specifically, inductor 212 of prematch network 202, a corresponding electrical current is induced within inductor 230. The current induced within inductor 230 flows through the other components of resonator structure 204 causing resonator structure 204 to operate. As resonator structure 204 resonates, the current flowing through inductor 230 is modified, which, in turn, affects the current flow through inductor 212. Consequently, resonator structure 204 is effectively coupled with prematch network 202.

In one embodiment, the impedance matching network 200 may be implemented within an IPD. Such an implementation may involve forming the IPD within an active surface of a wafer formed from a bulk semiconductor material, e.g., silicon. The IPD may be formed over the wafer by a variety of semiconductor processes, including layering, patterning, doping, and heat treatment. In the layering process, semiconductor materials can be grown or deposited on the wafer substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation. After the IPD is formed, the wafer may be singulated to separate the IPD from other devices that may be formed over the wafer. The IPD can then be connected to other components within an amplifier system.

To illustrate an IPD implementation of the present impedance match device, FIG. 3 shows a portion of an integrated circuit (IC) layout 300 on a semiconductor die including an IPD implementing the impedance match device of FIG. 2. FIG. 3 shows only a portion of the IPD, with element numbers in FIG. 3 indicating the location of the components of FIG. 2 having the same element numbers.

FIG. 3 depicts both prematch network 202 and resonator structure 204. IC layout 300 also includes an input (not shown) configured to receive an input signal and an output (not shown) configured to couple to an amplifier or transistor 302. In other embodiments, as described herein, the output may couple to other amplifiers or transistor devices.

Prematch network 202 includes capacitor 210 having a first terminal coupled to the input and a second terminal coupled to a ground terminal. The ground terminal may be a contact pad that may be electrically connected to a common voltage bus (e.g., a ground bus), for example, by a wire bond or other electrical connection. Inductor 212 is coupled between capacitor 210 and resistor 214.

Resonator structure 204 includes resistor 218 coupled to inductor 220, which is, in turn, connected to capacitor 222, which is, in turn, connected to a ground node. Inductor 220 in this example may be fabricated as a wire bond, though other suitable means of forming an inductor may be utilized. Inductor 220 is not inductively coupled to inductor 212 of prematch network 202. Inductor 220 is connected to capacitor 228. Inductor 230 is coupled between resistor 218 and capacitor 228. Because inductor 220 may be implemented as a wire bond, inductor 220 may be used for the purpose of tuning in the resonance location. In other embodiments, inductor 220 may be removed with element 230 being relied upon to provide sufficient inductance for resonator structure 204. In such an embodiment, elements 216, 230, and 222 may be rotated by 180 degrees and elements 218 and 228 may be coupled with a physical connection.

In the embodiment shown in FIG. 3, inductor 212 of prematch network 202 and inductor 230 of resonator structure 204 are inductively coupled to one another. It is important to note, here, that inductor 212 of prematch network 202 is not inductively coupled to inductor 220 of resonator structure 204 and that the only coupling between prematch network 202 and resonator structure 204 occurs due to the inductive coupling between inductors 212 and 230. As such, inductors 212 and 230 are oriented within IC layout 300 that that they run generally parallel to one another. Although inductors 212 and 230 are of differing lengths, the degree to which the two inductors 212 and 230 are inductively coupled will be at least partially determined that the length of the shortest inductor, as that dimension will dictate the length of the inductively coupled portions of both inductors. The inductively coupled inductors 212 and 230 may be arranged as two wires or lines implemented using planar, or edge-coupled configurations.

Figure 8A:
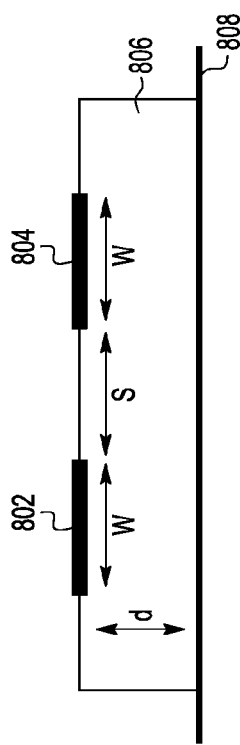
FIGS. 8A-8C show alternative implementations of inductively-capacitively coupled transmission lines.
Figure 8B:
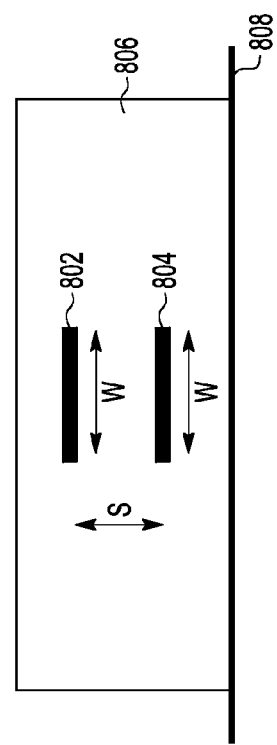
Figure 8C:
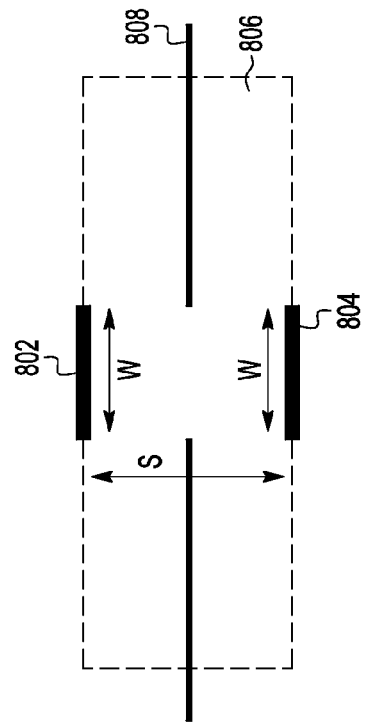

FIGS. 8A and 8B, for example, shows an illustration of edge-coupled inductors. In each example, inductors 802 and 804 are formed over or within a substrate 806. Substrate 806 is connected to ground plane 808. In each example, inductors 802 and 804 may be implemented as transmission lines having a width w and a separation distance s. Inductors 802 and 804 may also be implemented as microstrip or transmission lines coupled through a coupling aperture. FIG. 8C shows a configuration in which inductors 802 and 804 are formed within or on substrate 806 on opposite sides of ground plane 808. In that case, ground plane 808 includes an opening or aperture 810 enabling inductors 802 and 804 to become inductively coupled. In these various implementations, both the width w of and separation s between the coupled inductors will determine the coupling factor between the inductors. The inductors can be implemented using metal conductors and may be realized using wire bonds, or fabricated using monolithic processes.

In situations where the attributes of a particular impedance matching network are not known in advance, or will require fine-tuning based upon a particular device implementation, an IPD package may be relatively inflexible. Accordingly, in another embodiment, the prematch network and resonator structure are inductively coupled by wire bonds formed in each of the prematch network and resonator structures. In such an embodiment, the configuration of each of the wire bonds (e.g., the wire bonds' span and height) can be selected to achieve a desired degree of coupling between the prematch network and resonator structure. In such an embodiment, one or more of the components of each of the prematch network and resonator structure may each be formed within an IPD, with the wire bonds being coupled to the IPD. An implementation of the present impedance matching network utilizing wire bonds for inductive-capacitive coupling is illustrated in FIGS. 4 and 5.

Figure 4:
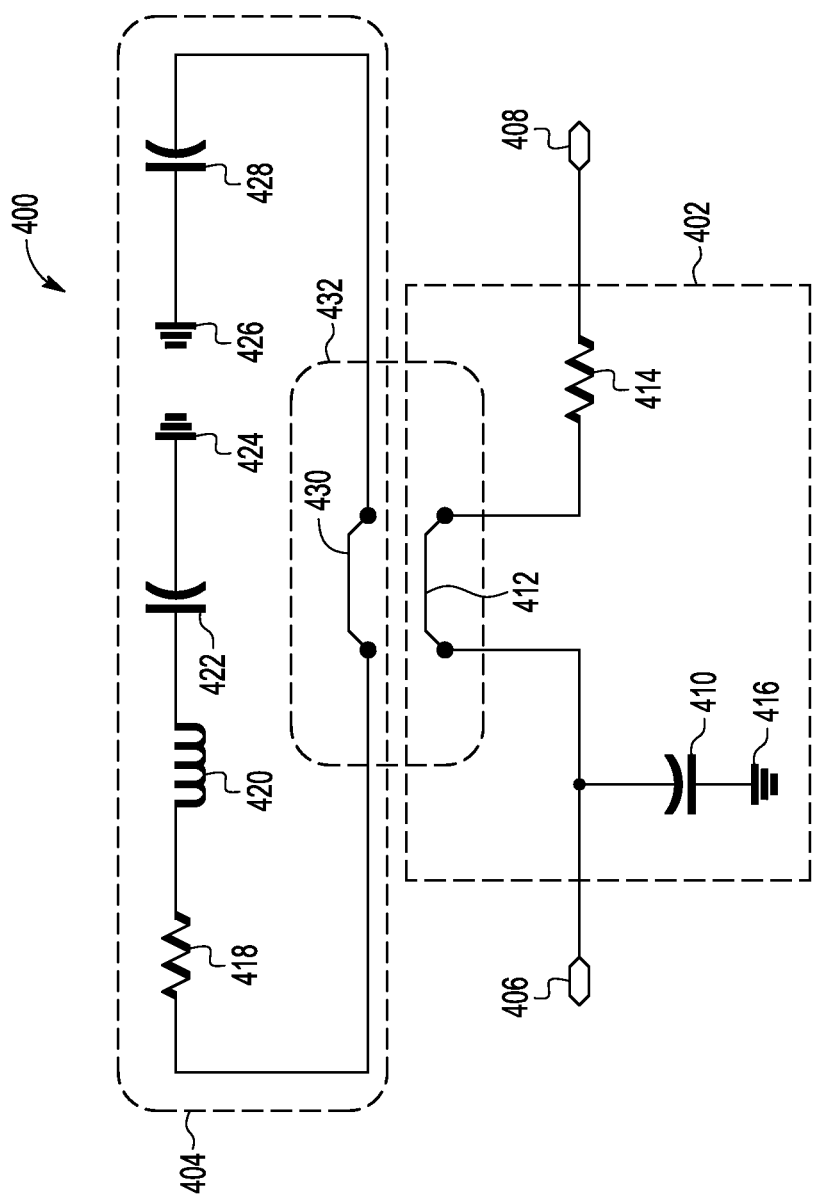
FIG. 4 shows an alternative embodiment of the present impedance matching device in which the prematch network and resonator structure are inductively coupled by wire bonds.
Figure 5:
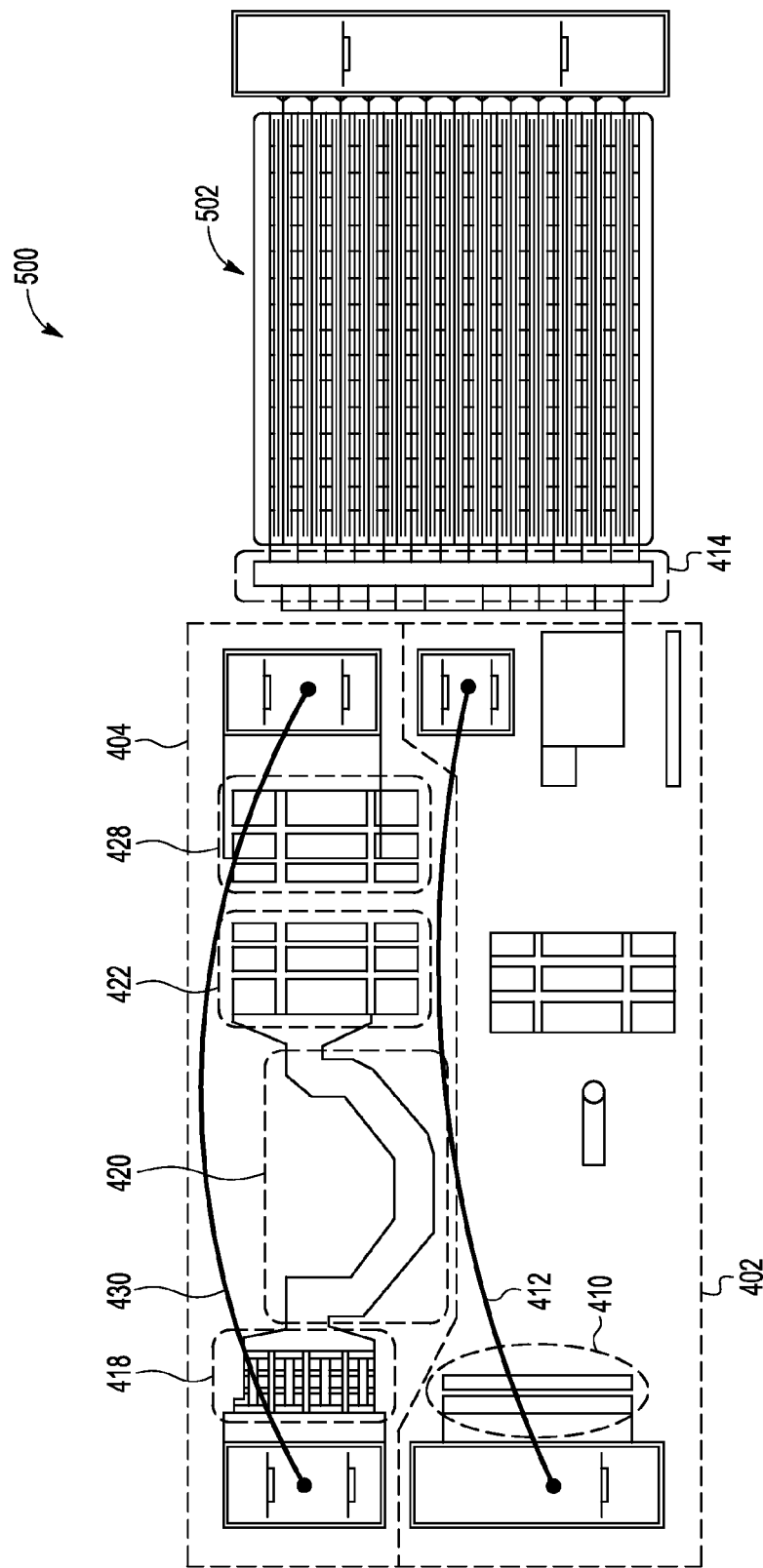
FIG. 5 shows an IC layout on a semiconductor die including the impedance match network of FIG. 4.

FIG. 4 is a schematic depicting an alternative impedance matching network 400 including prematch network 402 connected in parallel to resonator structure 404 via inductively-coupled wire bonds 412 and 430. Network 400 includes input 406. Input 406 is configured to couple to a signal source, such as a package reference plane. With reference to FIG. 1 therefore, input 406 may be configured to couple to signal source 104 directly or through resistor 106. Similarly, network 400 includes output 408. Output 408 is configured to couple to an amplifier, such as a power transistor. Accordingly, with reference to FIG. 1, output 408 may be configured to couple to an input of amplifier 108. In various embodiments, output 408 may couple to a power transistor, in which case output 408 may couple to the transistor's reference plane.

Prematch network 402 is connected directly to both input 406 and output 408, while, as shown in FIG. 4, resonator structure 404 is not directly connected to input 408, output 408, or prematch network 402.

Prematch network 402 includes capacitor 410 having a first terminal coupled to input 406 and a second terminal coupled to ground or reference voltage terminal 416. Wire bond 412 is coupled between capacitor 410 and resistor 414. In this configuration, because wire bond 412 has inductive properties, the combination of capacitor 410 and wire bond 412 operate as a shunt L match topology. In other embodiments, prematch network 402 could instead utility a T match topology, or any other combination of components arranged to provide the desired impedance matching.

The various component values of capacitor 410, wire bond 412, and resistor 414 can be selected to achieve a desired operation of prematch network 402 according to known circuit design techniques.

Resonator structure 404 includes resistor 418 coupled to inductor 420, which is, in turn, connected to capacitor 422, which is, in turn, connected to ground or reference voltage node 424. Ground node 426 is coupled to capacitor 428. Wire bond 430 is coupled between resistor 418 and capacitor 428.

Resonator structure 404 is not directly electrically coupled to prematch network 402. That is, an electrical conductor (i.e., metal) structure is not connected between resonator structure 404 and prematch network 402 to put them in electrical communication with one another. Instead resonator structure 404 is inductively coupled to prematch network 402 as a result of wire bond 430 and wire bond 412 being mutually coupled as indicated by dashed line 432. The mutual inductance of wire bonds 430 and 412 can be controlled by the configuration of wire bonds 430 and 412, such as by changing the length and curvature of each wire bond. The primary attributes of wire bonds 430 and 412 to control mutual inductance includes the length, height, and spacing between the wire bonds. To maximize mutual inductance, the wire bonds should be parallel to one another—the more deviation from parallel, the less coupling effect results.

In this configuration, as current flows through prematch network 402 and, specifically, wire bond 412 of prematch network 402, a corresponding electrical current is induced within wire bond 430. The current induced within wire bond 430 flows the other components of resonator structure 404 causing resonator structure 404 to operate. As resonator structure 404 resonates, the current flowing through wire bond 430 is modified, which, in turn, affects the current flow through wire bond 412. Consequently, resonator structure 404 is effectively coupled with prematch network 402, resulting in the desired circuit operation.

In this embodiment, the use of wire bonds 430 and 412 to inductively couple prematch network 402 and resonator structure 404 allows increased flexibility in controlling the operation of both prematch network 402 and resonator structure 404. In many cases, simulations of the present impedance matching device may be utilized to determine values for circuit components as well as the configuration of wire bonds 412 and 430 in order to achieve desired operation.

The wire bond inductance coupling depicted in FIG. 4 may be appropriate for circuits operating at a relatively high frequency, and consequently requiring relatively low inductance values in an impedance matching network. For example, for circuits operating at frequencies greater than 2 gigahertz (GHz), the wire bond implementation of FIG. 4 may be appropriate. In relatively low-frequency circuits, the inductance achievable with a conventional wire bond may not be sufficiently high to provide desired impedance matching and resonance performance. In that case, an implementation such as that of FIGS. 2-3 (e.g., using inductors formed as half-turn coils within an IPD) may be utilized. An additional factor that may influence the design of the present impedance matching device when incorporated into various systems includes the device terminating impedance. For example, a 100 watt system may have a relatively low terminal impedance versus a similar 5 watt device. As such, the same change of impedance would be different for low terminal impedance versus terminal impedances that are larger. Additionally, amplifier application may play an important role in impedance matching device design. When an amplifier is used as a driver, power loss and efficiency may not be as critical as gain and linearity and, consequently, the impedance matching device design may be implemented with conventional inductors within an IPD versus making use of wire bonds. But, in a final stage amplifier, power loss and efficiency may be more important and, therefore, designs utilizing wire bonds may be preferred because they may reduce power losses over IPD implementations.

FIG. 5 shows an IC layout 500 on a semiconductor die including the impedance match network of FIG. 4. FIG. 5 shows only a portion the die, with element numbers in FIG. 5 indicating the location of the components of FIG. 4 having the same element numbers.

FIG. 5 depicts both prematch network 402 and resonator structure 404. Network 400 includes an input (not shown) configured to receive an input signal and an output configured to couple to transistor 302. In other embodiments, as described herein, the output may couple to other amplifiers or transistor devices.

Prematch network 402 includes capacitor 410 having a first terminal coupled to the input and a second terminal coupled to a ground or reference voltage terminal. In this example, the ground node can be a contact pad that may be electrically connected to a common voltage bus (e.g., a ground bus), for example, by a wire bond or other electrical connection. Wire bond 412 is coupled between capacitor 410 and resistor 414.

Resonator structure 404 includes resistor 418 coupled to inductor 420, which is, in turn, connected to capacitor 422, which is, in turn, connected to a ground node. A ground node is coupled to capacitor 428. Wire bond 430 is coupled between resistor 418 and capacitor 428.

In the embodiment shown in FIG. 5, wire bond 412 of prematch network 402 and wire bond 430 of resonator structure 404 are inductively coupled to one another. The length and curvature of wire bonds 412 and 430 are selected to achieve a desired amount of mutual inductance. As such, wire bonds 412 and 430 are oriented within IC layout 500 that that they run generally parallel to one another.

In alternative embodiments, two or more resonator structures may be incorporate into the present impedance matching network. Multiple resonator structures may be utilized for relatively large power amplifier periphery devices. A large periphery device tends to have duplicate matching network across FET fingers so that each location across the whole FET sees an equivalent impedance regardless how far away the finger is from the center of the FET. A single resonator structure has limits on the coupling distance relative to other similar matching structures locations over the whole power amplifier. As such, multiple resonators may be useful to provide the same impedance coupling across the entire prematch network.

Figure 6:
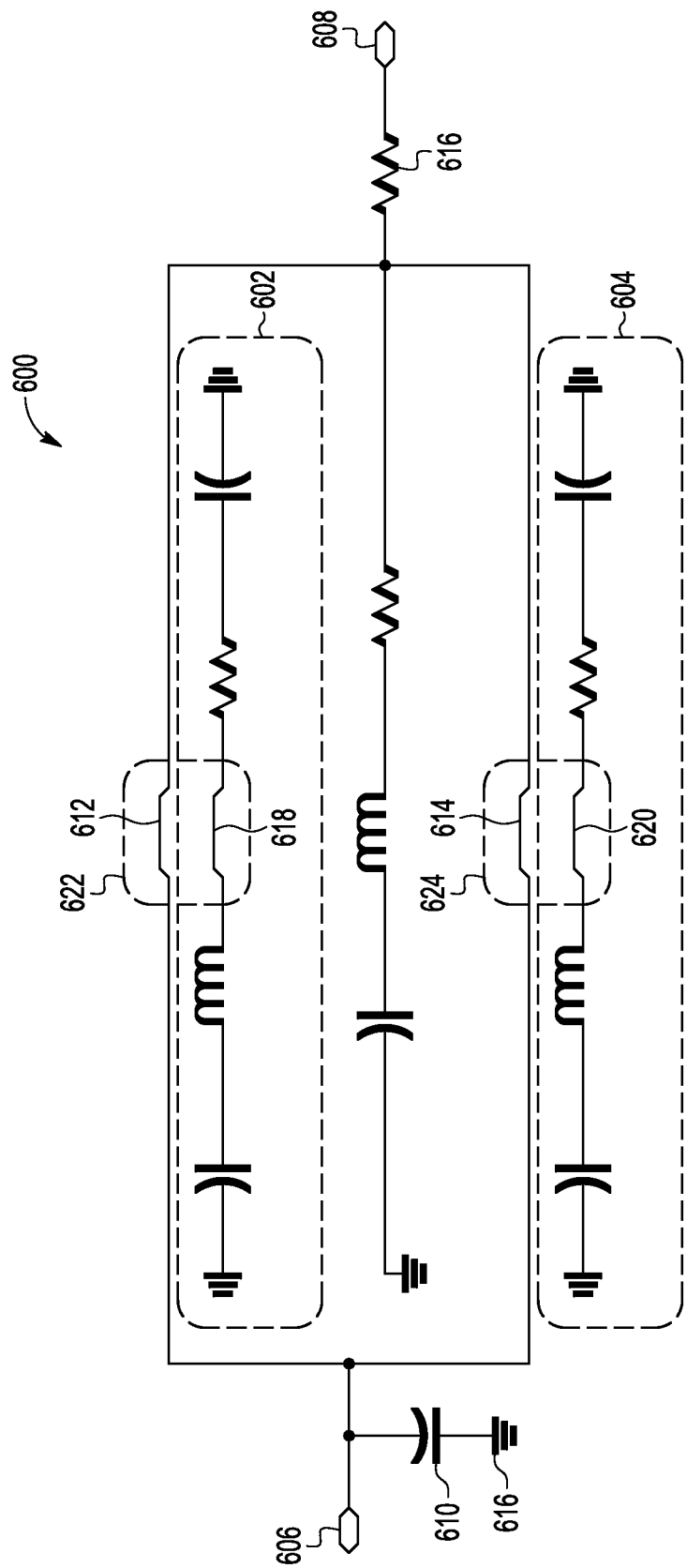
FIG. 6 is a schematic depicting an impedance matching device including a prematch network connected in parallel to a plurality of resonator structures.

FIG. 6, for example, is a schematic depicting an impedance matching network 600 including a prematch network connected in parallel to a first resonator structure 602 and a second resonator structure 604. Network 600 includes input 606. Input 606 is configured to couple to a signal source, such as a package reference plane. Output 608 is configured to couple to an amplifier, such as a power transistor.

The prematch network is connected directly to both input 606 and output 608, while, as shown in FIG. 6, neither of resonator structures 602 or 604 are directly connected to input 608, output 608, or the prematch network.

The prematch network includes capacitor 610 having a first terminal coupled to input 606 and a second terminal coupled to ground or reference voltage terminal 616. Wire bonds 612 and 614 are coupled between capacitor 610 and resistor 616. In other embodiments, the prematch network could utilize any suitable topology using any combination of components arranged to provide the desired impedance matching.

The various component values of capacitor 610, wire bonds 612 and 614, and resistor 616 can be selected to achieve a desired operation of the prematch network according to known circuit design techniques.

Resonator structure 602 includes, in addition to other components, wire bond 618, which is inductively coupled to wire bond 612 as indicated by dashed line 622. Resonator structure 602 is not directly electrically coupled to the prematch network. That is, an electrical conductor (i.e., metal) structure is not connected between resonator structure 602 and the prematch network to put them in electrical communication with one another. Instead resonator structure 602 is inductively coupled to the prematch network as a result of wire bond 612 and wire bond 618 being mutually coupled. As such, a variation in current in one of wire bonds 612 and 618 will affect current flow through the other of wire bonds 612 and 618. The mutual inductance of wire bonds 612 and 618, and, thereby the operation of the prematch circuit and resonator structure 602, can be controlled by the configuration of wire bonds 612 and 618, such as by changing the length and curvature of each wire bond.

Resonator structure 604 includes, in addition to other components, wire bond 620, which is inductively coupled to wire bond 614 as indicated by dashed line 624. Resonator structure 604 is not directly electrically coupled to the prematch network. That is, an electrical conductor (i.e., metal) structure is not connected between resonator structure 604 and the prematch network to put them in electrical communication with one another. Instead resonator structure 604 is inductively coupled to the prematch network as a result of wire bond 614 and wire bond 620 being mutually coupled. As such, a variation in current in one of wire bonds 614 and 620 will affect current flow through the other of wire bonds 614 and 620. The mutual inductance of wire bonds 614 and 620, and, thereby the operation of the prematch circuit and resonator structure 604, can be controlled by the configuration of wire bonds 614 and 620, such as by changing the length and curvature of each wire bond.

In other embodiments, the impedance matching network may be implemented using any suitable technology. For example, the network may be implemented using a number of discrete devices that are mounted to and interconnected by a PCB or other structure. In still other embodiments, combinations of IPDs and discrete devices may be utilized to implement the present impedance matching network. The impedance matching network could also be implemented within a multi-layer package structure.

Embodiments of the present invention, which include both a prematch network and one or more parallel-connected resonator structures, provide improved impedance matching functionality. For example, the network may provide additional resonance at higher operating frequencies. For example, depending upon matching topology, an impedance resonance may be implemented either above or below the frequency of operation. A typical T match network could place an impedance resonance at a higher frequency location (e.g., 2300 MHz) than an operating frequency, say 1800-2100 MHz. A shunt L match could do the opposite, placing an impedance resonance at a lower frequency (e.g., 1600

MHz) than the operating frequency. To achieve a desired resonance, in some cases an additional lateral Tmatch network may be required. Using the present approach, however, a parallel resonance structure may be implemented to create the same resonance that would otherwise be achieved with an additional T match network.

Figure 7:
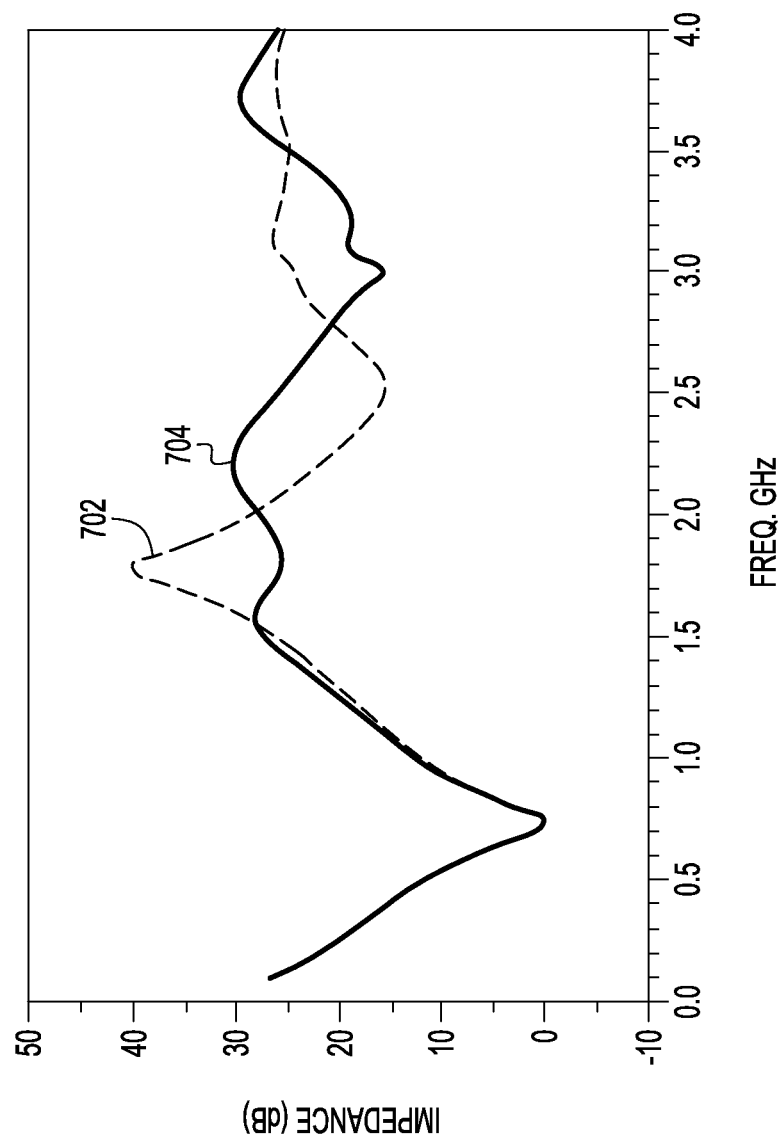
FIG. 7 is a graph showing impedance versus frequency for simulation results of various impedance matching networks.

FIG. 7, for example, is a graph showing impedance versus frequency for simulation results of an impedance matching network that does not include a resonator (line 702) and an impedance matching network that does include a resonator structure (line 704). As shown, in the impedance matching network that includes a resonator structure, impedance is reduced around 1.5 GHz, but at higher frequencies, impedance is increased. The actual response of the impedance matching network and resonator structure can be fine-tuned by adjusting capacitor values (e.g., the capacitance values of capacitors 222, 228, 422, or 428) within the resonator structures. Additionally, by varying the capacitance values, it's possible to achieve a desired circuit stability for a target frequency, sometimes referred to as the circuit's Mu factor. Additionally, by varying the resistance values of resistors within the resonator structures (e.g., resistors 218, and 418), circuit stability can be controlled. The adjustments may also raise the harmonic impedance of the impedance matching network.

For the sake of brevity, conventional techniques relating to high-power amplifiers, such as Doherty amplifiers, load modulation, impedance matching, integrated circuit design or fabrication, transistor design or fabrication, and other functional aspects of the systems (and the individual operating components of the systems) may not be described in detail herein. Furthermore, the connecting lines shown in the various figures contained herein are intended to represent exemplary functional relationships or physical couplings between the various elements. It should be noted that many alternative or additional functional relationships or physical connections may be present in an embodiment of the subject matter. In addition, certain terminology may also be used herein for the purpose of reference only, and thus are not intended to be limiting.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "substantial" and "substantially" herein mean sufficient to accomplish the stated purpose in a practical manner and that minor imperfections, if any, are not significant for the stated purpose.

In conclusion, systems, devices, and methods configured in accordance with example embodiments of the invention relate to:

A device including an input terminal configured to receive a radio frequency signal, an output terminal configured to couple to an amplifier, an impedance prematch network coupled to the input terminal and the output terminal, the impedance prematch network including a first inductive element, and a resonator structure including a second inductive element inductively coupled to the first inductive element.

A device including an input terminal configured to receive a signal, an impedance prematch network having a first terminal coupled to the input terminal and a second terminal coupled to an output terminal, a resonator structure including a first component inductively coupled to a second component in the impedance prematch network, and an amplifier coupled to the output terminal.

A device including an impedance prematch network, and a resonator structure inductively coupled in parallel to the impedance prematch network.

The foregoing description was primarily directed to preferred embodiments of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:
1. A device, comprising:
an input terminal configured to receive a radio frequency signal;
an output terminal configured to couple to an amplifier;

an impedance prematch network coupled to the input terminal and the output terminal, the impedance prematch network including a first inductive element; and a resonator structure including a second inductive element inductively coupled to the first inductive element, wherein the impedance prematch network and the resonator structure are only electrically connected by the inductive coupling of the first wire bond and the second wire bond.

2. The device of claim 1, wherein the first inductive element is a first wire bond and the second inductive element is a second wirebond.

3. The device of claim 1, wherein the resonator structure includes:

a second capacitor connected between a first terminal of the first wire bond and a third reference voltage terminal; and a third capacitor connected between a second terminal of the first wire bond and a fourth reference voltage terminal.

4. The device of claim 1, including a second resonator structure including a third wire bond inductively coupled to a fourth wire bond in the impedance prematch network.

5. The device of claim 4, wherein the second resonator structure includes a fourth capacitor connected between a first terminal of the third wire bond and a fifth reference voltage terminal; and a fifth capacitor connected between a second terminal of the third wire bond and a sixth reference voltage terminal.

6. A device, comprising:

an input terminal configured to receive a signal;

an impedance prematch network having a first terminal coupled to the input terminal and a second terminal coupled to an output terminal;

a resonator structure including a first component inductively coupled to a second component in the impedance prematch network, wherein the impedance prematch network and the resonator structure are coupled in parallel; and an amplifier coupled to the output terminal.

7. The device of claim 6, wherein the first component includes a first wire bond and the second component includes a second wire bond.

8. The device of claim 7, wherein the impedance prematch network includes:

a first capacitor connected between a first terminal of the first wire bond and a first reference voltage terminal; and an inductor connected between a second terminal of the first wire bond and a second reference voltage terminal.

9. The device of claim 7, wherein the resonator structure includes:

a second capacitor connected between a first terminal of the second wire bond and a third reference voltage terminal; and a third capacitor connected between a second terminal of the second wire bond and a fourth reference voltage terminal.

10. The device of claim 6, wherein the first component includes a first inductor and the second component includes a second inductor.

11. The device of claim 10, wherein the impedance prematch network and the resonator are in an integrated passive device.

12. The device of claim 6, wherein the amplifier includes a transistor and the output terminal is coupled to a reference plane of the transistor.

13. An impedance matching device, comprising:

an impedance prematch network; and a resonator structure inductively coupled in parallel to the impedance prematch network, wherein the impedance prematch network and the resonator structure are only electrically connected by inductive coupling.

14. The impedance matching device of claim 13, wherein the impedance prematch network includes a first inductor and the resonator structure includes a second inductor and the first inductor is inductively coupled to the second inductor.

15. The impedance matching device of claim 14, wherein at least one of the first inductor and the second inductor includes a wire bond.

16. The impedance matching device of claim 14, wherein the impedance prematch network and the resonator structure are in an integrated passive device.

17. The impedance matching device of claim 13, wherein the impedance prematch network includes an input terminal configured to receive a signal and an output terminal configured to couple to an amplifier.

18. The impedance matching device of claim 14, wherein the first inductor includes a first wire bond and the second inductor includes a second wire bond.

19. The impedance matching device of claim 18, wherein the impedance prematch network includes:

a first capacitor connected between a first terminal of the first wire bond and a first reference voltage terminal; and a resistor connected between a second terminal of the first wire bond and an output terminal.

20. The impedance matching device of claim 18, wherein the resonator structure includes:

a second capacitor connected between a first terminal of the second wire bond and a second reference voltage terminal; and a third capacitor connected between a second terminal of the second wire bond and a third reference voltage terminal.

* * * * *